(12) United States Patent
Kim et al.

(10) Patent No.: US 6,429,107 B2
(45) Date of Patent: Aug. 6, 2002

(54) METHOD FOR FORMING CONDUCTIVE CONTACT OF SEMICONDUCTOR DEVICE

(75) Inventors: Hyoung-joon Kim, Seoul; Byeong-yun Nam; Kyung-won Park, both of Suwon, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/839,855

(22) Filed: Apr. 20, 2001

(30) Foreign Application Priority Data

Jun. 30, 2000 (KR) ........................... 2000-37397

(51) Int. Cl.[7] ........................... H01L 21/3205
(52) U.S. Cl. ........................... 438/586
(58) Field of Search ........................... 438/183, 184, 438/586, 587, 597, 618

(56) References Cited

U.S. PATENT DOCUMENTS 5,547,900 A * 8/1996 Lin

FOREIGN PATENT DOCUMENTS

KR 1998-084290 12/1998

OTHER PUBLICATIONS

Tetsuya Homme et al. "A selective $SiO_2$ Film–Formation Technology Using Liquid–phase Deposition for Fully Planarized Multilevel Interconnections"; *J Electrochem. Soc.*, vol. 140, No. 8., Aug. 1993.
English language Abstract of 1998–084290.

* cited by examiner

*Primary Examiner*—Keith Christianson
(74) *Attorney, Agent, or Firm*—Marger Johnson & McCollom, P.C.

(57) ABSTRACT

A method for forming a conductive contact of a semiconductor device is provided. According to one aspect of the present invention, a dummy dielectric layer pattern having a dummy opening and an interdielectric layer pattern having a lower etch-rate than that of the dummy dielectric layer, for filling the dummy opening are formed on a semiconductor substrate. The dummy dielectric layer pattern using the interdielectric layer pattern as an etching mask is selectively removed, and a contact opening for exposing the semiconductor substrate of a portion in which the dummy dielectric layer pattern is located.

24 Claims, 6 Drawing Sheets

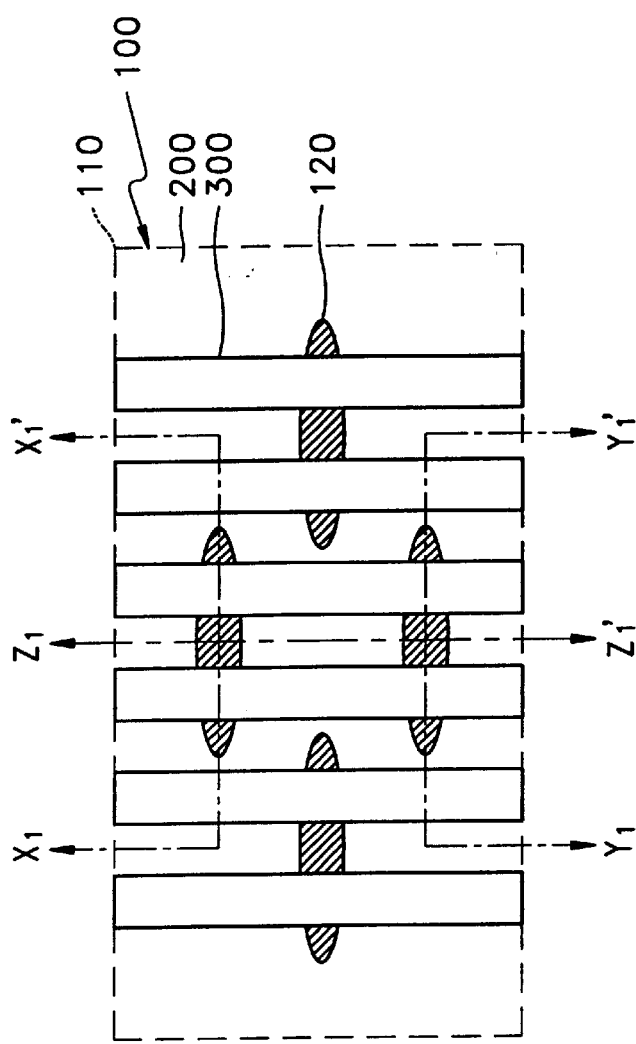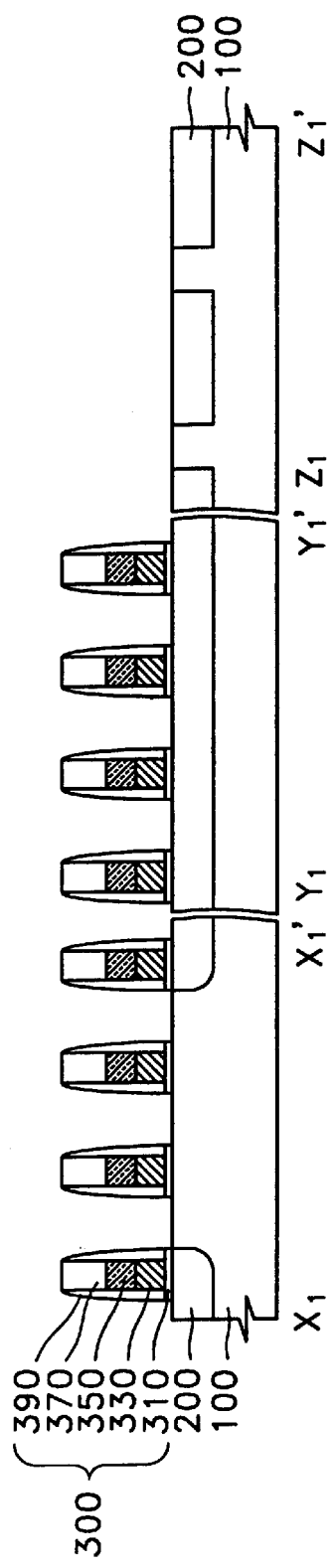
FIG. 1A
FIG. 1B

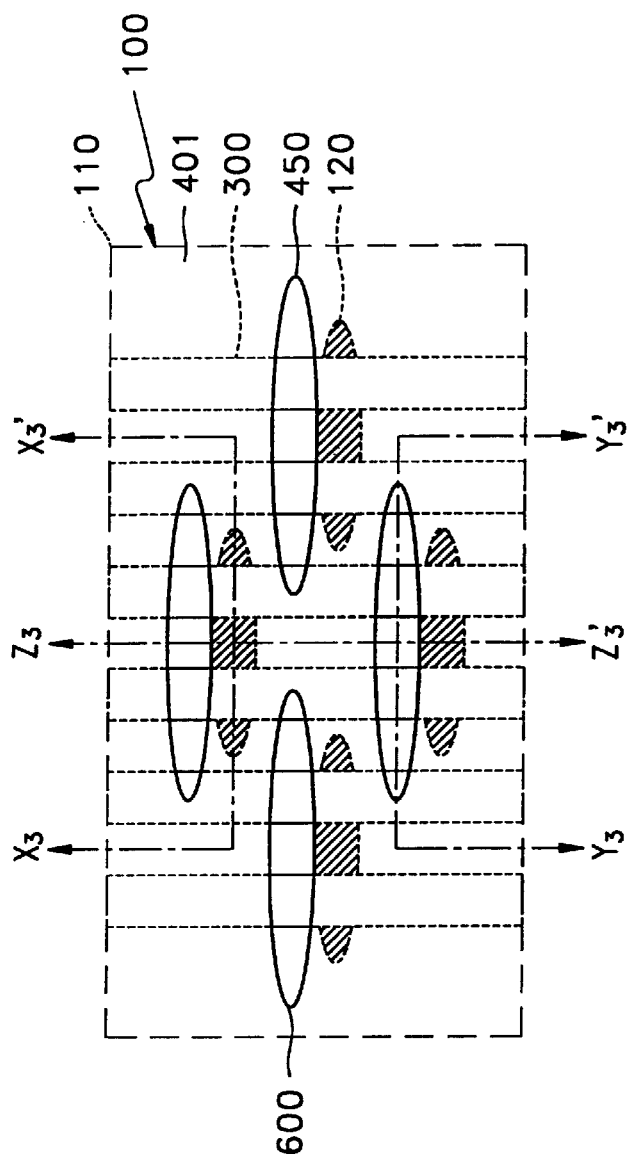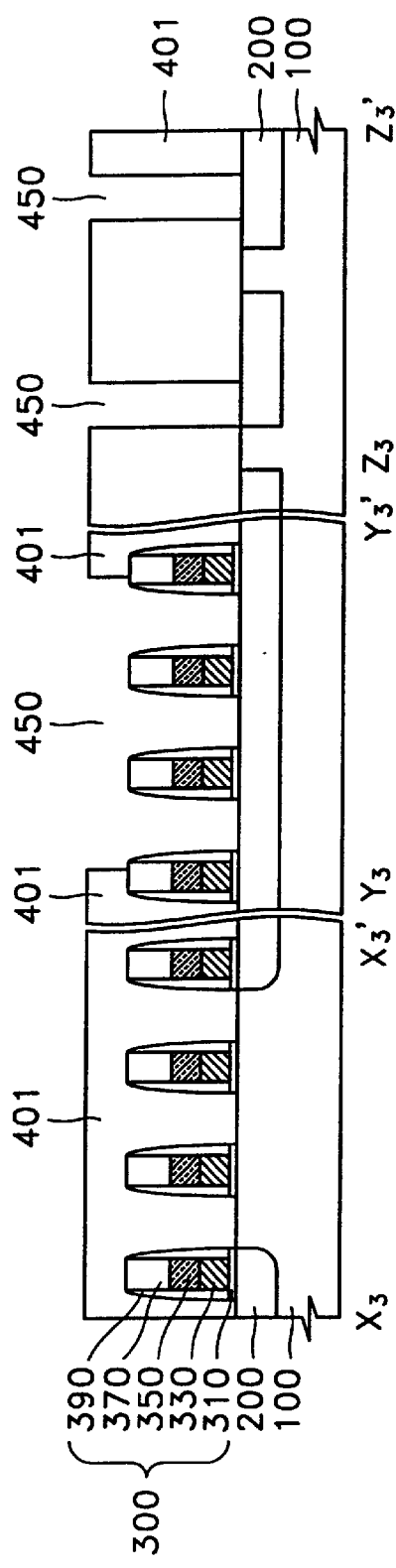
FIG. 3A
FIG. 3B

METHOD FOR FORMING CONDUCTIVE CONTACT OF SEMICONDUCTOR DEVICE

This application claims priority on Korean application number 2000-37397, filed Jun. 30, 2000 in the name of Samsung Electronics Co., Ltd. and is herein incorporated by reference for all purposes.

BACKGROUND OF THE INVENTION

1. Field of the Invention

The present invention relates to a method for manufacturing a semiconductor device, and more particularly, to a method for forming an interdielectric layer having openings by using a difference in an etch-rate and for forming a conductive contact for filling the openings.

2. Description of the Related Art

As the integration density of semiconductor devices increases, the misalignment margins in a photolithographic process becomes narrower. As a result, it is not easy to achieve the necessary misalignment margin when manufacturing the semiconductor devices. Thus, an electrical short-circuit can occur between a gate line and a contact pad adjacent to the gate line, or between a bit line and a buried contact (BC) adjacent to the bit line, or between the gate line and the BC or a direct contact (DC).

In order to overcome this problem, a self aligned contact (SAC) etching process has been implemented. However, the SAC etching process has limitations in views of non-opening and a selectivity.

In detail, since the bonding energy of silicon dioxide ($SiO_2$), which used as an interdielectric layer, is large, the interdielectric layer does not have a very high etching selectivity with respect to silicon nitride ($Si_3N_4$), which is used to form a spacer. As a result, it is necessary to increase the thickness of the spacer, and due to the increased thickness of the spacer, the interval between the gate lines becomes narrower and the aspect ratio increases.

Due to the increase in the aspect ratio when forming the contact hole, it is more difficult to obtain the bottom critical dimension of the contact hole. As a result, a defect occurs in which the hole does not open properly. Also, the increase in the aspect ratio of the contact hole causes filling failures such as voids or seams in the interdielectric layer when filling the contact hole.

SUMMARY OF THE INVENTION

To solve the above problems, it is a feature of the present invention to provide a method for forming a conductive contact. The method is capable of preventing an electrical short-circuit and preventing a contact hole from not opening, while realizing a high etch selectivity with respect to a spacer when forming the contact hole, thereby reducing the required thickness of the spacer and allowing the spacer to be formed of a material having a low dielectric constant.

Accordingly, to achieve the above feature, according to one aspect of the present invention, a dummy dielectric layer comprised of insulating materials having a relatively high etch-rate and an interdielectric layer pattern having a lower etch-rate than that of the dummy dielectric layer are formed on a semiconductor substrate. The dummy dielectric layer is selectively removed by using a high etching selectivity between the dummy dielectric layer and the interdielectric layer pattern, and thereby forming a contact opening exposing a portion in which a contact will be formed.

Here, the dummy dielectric layer is formed of an organic material, and the interdielectric layer pattern is formed of a silicon dioxide ($SiO_2$) layer which is in one preferred embodiment, selectively deposited from a liquid phase precursor.

Meanwhile, in order to form the contact opening, the dummy dielectric layer is selectively etched, to form a dummy opening which exposes a portion in which the contact body is not formed: The interdielectric layer is then formed to fill the dummy opening. The dummy dielectric material remaining in the contact area is then selectively etched to form the contact opening. The contact opening is filled with conductive materials and divided into the contact body by using surface etching or polishing.

According to the present invention, by introducing the dummy dielectric layer pattern formed of the organic material, the defects that occur when forming the contact opening can be minimized.

BRIEF DESCRIPTION OF THE DRAWINGS

The above feature and advantages of the present invention will become more apparent by describing in detail a preferred embodiment thereof with reference to the attached drawings in which:

FIGS. 1A and 1B through FIGS. 6A and 6B are plan views and sectional views illustrating a method for manufacturing a conductive contact of a semiconductor device according to a preferred embodiment of the present invention.

DETAILED DESCRIPTION OF THE INVENTION

Figure 2A:
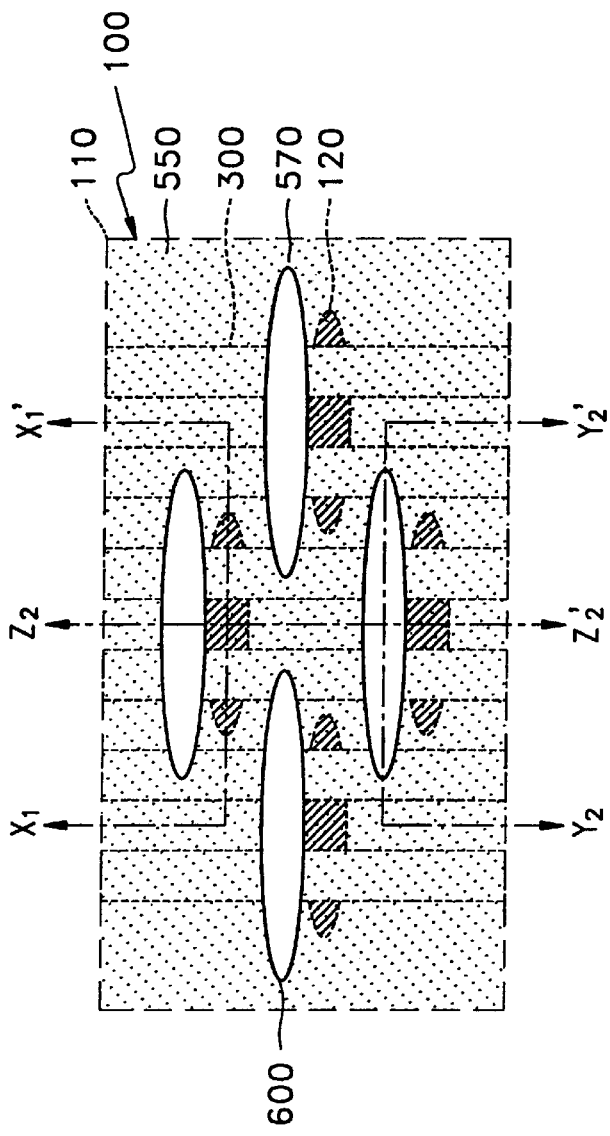

The present invention will be described more fully hereinafter with reference to the accompanying drawings in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. Like reference numerals refer to like elements throughout the drawings. It will be understood that when a layer is referred to as being on another layer or "on" a semiconductor substrate, it can be directly on the other layer or on the semiconductor substrate, or intervening layers may also be present.

FIG. 1A is a plan view schematically illustrating the step of forming a gate line 300 on a semiconductor substrate 100, and FIG. 1B is a sectional view taken along line $X_1$-$X_1$'-$Y_1$-$Y_1$'-$Z_1$-$Z_1$' of FIG. 1A.

In detail, the gate line 300 is formed of a line-type on the semiconductor substrate 100 using a conventional process of manufacturing a transistor. For example, after forming an isolation region 200 on the semiconductor substrate 100 using a shallow trench isolation (STI) process, gates 330 and 350 are formed of a line-type conductive pattern so as to intersect an active region 120 defined by the isolation region 200.

The gates 330 and 350 are formed by interposing a gate oxide layer 310 between the gates 330 and 350 and the substrate 100. The gates 330 and 350 are formed of various conductive materials. For example, the gates 330 and 350 may be formed by sequentially forming a polycrystalline silicon layer 330 and a silicide layer 350 on the gate oxide layer 310 and patterning them. Here, the silicide layer 350 can be formed of metal silicide such as tungsten silicide (WSi). Also, the gates can be only formed of metal materials such as tungsten (W).

Before patterning the gates 330 and 350, a hard mask 370 may be formed by depositing insulating materials, for example, silicon nitride (Si$_3$N$_4$) or silicon dioxide (SiO$_2$) on the silicide layer 350. The hard mask 370 may also be formed of silicon oxynitride (SiON) or silicon carbide (SiC).

This is to implement a high etching selectivity of the hard mask 370 in a process of forming the following contact. As a result, it can be prevented that the hard mask 370 is damaged to occur the exposure of the gates 330 and 350. The hard mask 370 is patterned together when patterning the gates 330 and 350 and shields the top of the gates 330 and 350 to be protected.

After the gates 330 and 350 are formed, a spacer 390 for covering the sidewalls of the gates 330 and 350 is formed using a conventional spacer process. The spacer 390 can be formed of an insulating material such as silicon nitride (Si$_3$N$_4$) or silicon dioxide (SiO$_2$). Also, the spacer 390 can be formed of silicon oxynitride (SiON) or silicon carbide (SiC). Preferably, the spacer 390 is formed of silicon nitride (Si$_3$N$_4$) so as to provide a high selectivity in the following etching process.

As described above, the spacer 390 and the hard mask 370 comprise shielding dielectric layers 370 and 390 for protecting the gates 330 and 350. A stopper layer used as the end point of etching in an etching process or a polishing process can be further formed on the shielding dielectric layers 370 and 390, but the stopper layer can be omitted in the preferred embodiment of the present invention.

Meanwhile, the problems of the SAC process due to the integration of semiconductor devices as described previously usually occur in a cell region 110. The following description of a preferred embodiment of the present invention is focused on the cell region 110. In the preferred embodiment of the present invention, the gate line 300 will be described as the example of a conductive line, but the present invention can be also applied to the conductive line for use in conventional interconnections.

In a case where the conductive line is used as interconnections, the conductive line includes a conductive pattern formed of polycrystalline silicon, titanium (Ti), titanium nitride (TiN), aluminum (Al), copper (Cu), tungsten (W), tungsten silicide (WSi), platinum (Pt), or another metal having high conductivity, and an upper layer of a metallic conductive oxide, or silicide. The spacer 390 is formed on the sidewalls of the conductive pattern, and the hard mask 370 is formed on the top of the conductive pattern.

Figure 2B:
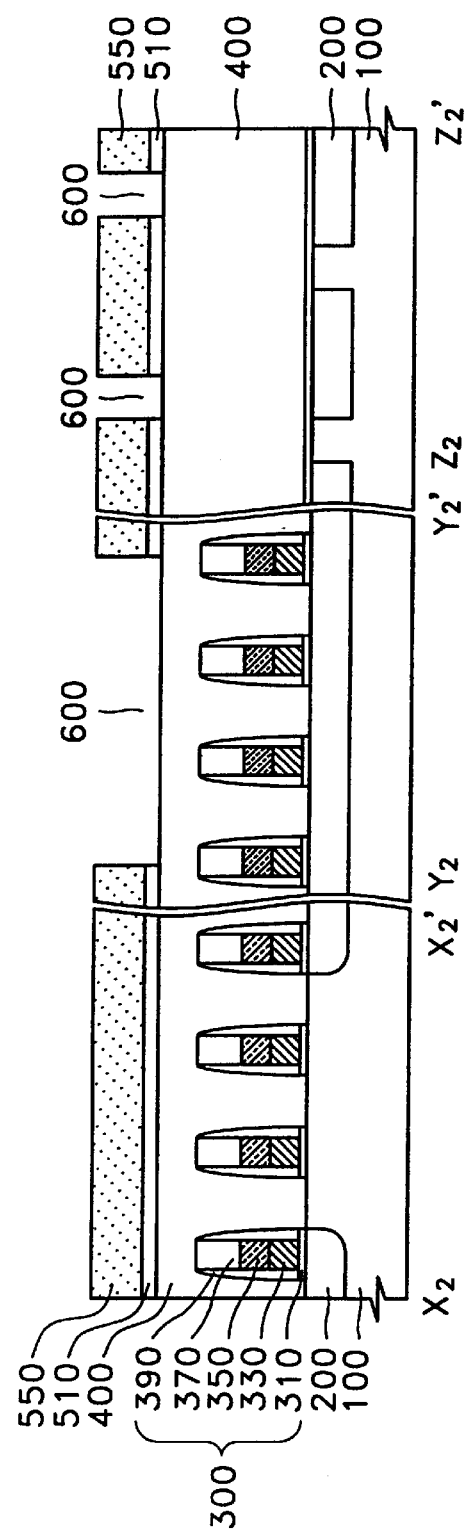

FIG. 2A is a plan view schematically illustrating the step of forming a dummy dielectric layer 400 and forming a photoresist pattern 550 on the dummy dielectric layer 400, and FIG. 2B is a sectional view taken along lines X$_2$-X$_2$', Y$_2$-Y$_2$', and Z$_2$-Z$_2$' of FIG. 2A.

Specifically, the dummy dielectric layer 400 for filling a gap between gate lines 300 is formed on a semiconductor substrate 100. The dummy dielectric layer 400 is formed of an insulating material having a flowability that is high enough so that it can fill the gap between the gate lines 300. Also, since the dummy dielectric layer 400 has a high dry or wet etch-rate compared to a hard mask 370 or the spacer 390, specifically, the dummy dielectric layer 400 is formed of an insulating material having a high etching selectivity to the hard mask 370 or the spacer 390.

This is to prevent the spacer 390 or the hard mask 370 from being damaged by the following process of patterning or removing the dummy dielectric layer 400. As a result, the gates 330 and 350 can be protected from damage by the following process. Further, preferably, the dummy dielectric layer 400 is formed of an insulating material having a very high wet or dry etch-rate compared to an insulating material comprising an interdielectric layer to be formed later.

The dummy dielectric layer 400 can be formed of an organic material such as polymer. For example, the dummy dielectric layer 400 can be formed of a resist material used in a photolithographic process of semiconductor processes. Also, the dummy dielectric layer 400 can be formed of a material used in forming an organic antireflective layer in the semiconductor processes, that is, an organic antireflective layer material. Or, the dummy dielectric layer 400 can be formed of an insulating material having a high dry etch-rate such as an organic insulator, such as, FLARE (manufactured by AlliedSignal Advanced Microelectronic Materials).

As described above, a photoresist layer 550 is formed on the dummy dielectric layer 400, and the photoresist layer is exposed and developed, thereby forming a photoresist pattern 550 exposing a portion 600. Portion 600 comprises a portion of the cell region 110 in which a contact will not be formed.

In a case where the dummy dielectric layer 400 is formed of the resist material or the organic antireflective layer material, it may be difficult to provide an adequate etching selectivity between the resist material or the organic antireflective layer of the dummy dielectric layer 400 and the photoresist pattern 550 used in the following process of patterning the dummy dielectric layer 400. Thus, in this case, an etching mask layer 510 can be formed on the dummy dielectric layer 400. Preferably, the etching mask layer 510 is preferably formed of a material having a higher etching resistance than the resist material or organic antireflective layer material. Suitable materials include, silicon dioxide (SiO$_2$), silicon nitride (Si$_3$N$_4$), silicon carbide (SiC), or silicon oxynitride (SiON).

However, in a case where the dummy dielectric layer 400 is formed of the organic material such as the FLARE, it is possible to provide an etching selectivity between the organic insulator of FLARE and the photoresist pattern 550 by selecting an appropriate etching gas used in dry etching. Thus, in a case where the dummy dielectric layer 400 is formed of the organic insulator, the etching mask layer 510 can be omitted.

Meanwhile, the portion 600 of the dummy dielectric layer 400 can correspond to an isolation region 200 between active regions 120. Since the active regions 120 can be formed in the shape of (-)-type or t-type arrangement, the portion 600 to be exposed by the photoresist pattern 550 can be set in a long oval type or (-)-type for exposing a region between active regions 120. Thus, the photoresist pattern 550 is shielded by covering the portion on which the contact will be formed.

FIG. 3A is a plan view schematically illustrating the step of forming a dummy dielectric layer pattern 401 having a dummy opening 450, for patterning the dummy dielectric layer 400, and FIG. 3B is a sectional view taken along line X$_3$-X$_3$', Y$_3$-Y$_3$', and Z$_3$-Z$_3$' of FIG. 3A.

In detail, the dummy dielectric layer 400 is selectively etched using the photoresist pattern 550 as an etching mask, and a dummy dielectric layer pattern 401 having a dummy opening 450 exposing gap regions between gate lines 300 is formed. Here, an etching process of forming the dummy opening 450 can be performed by a selective dry etching, and the dummy opening 450 exposes substrates 100 of gap regions between the gate lines 300 on which a contact will be not formed.

For example, in a case where the dummy dielectric layer 400 is formed of a resist material or an organic antireflective layer material, the etching process can be performed by dry etching in which an oxygen source is used. Since the resist material or the organic antireflective layer material forming the dummy dielectric layer 400 is comprised of organic materials such as polymer, the resist material or the organic antireflective material can be removed by the dry etching.

Here, the photoresist pattern 550 can be together removed in the dry etching, but the etching mask layer 510 acts as a hard mask, and the dummy dielectric layer 400 is selectively patterned to form the dummy dielectric layer pattern 401. After the dry etching, the etching process can be supplemented by additionally performing a wet etching process such a strip process in which phosphoric acid is used, and by removing residual materials after dry etching. After the dummy dielectric layer pattern 401 is formed, the etching mask layer 510 is removed.

Meanwhile, in a case where the dummy dielectric layer 400 is formed of an organic insulator, the etching process can be performed by dry etching in which etching gas containing nitrogen (N) gas or hydrogen (H) gas is used. Since the gas used in the dry etching process has an etching selectivity between the photoresist pattern 550 and the organic insulator of the dummy dielectric layer 400, the dummy dielectric layer 400 of the organic insulator can be selectively patterned with respect to the photoresist pattern 550. Thus, the etching mask layer 510 can be omitted.

Meanwhile, in the etching process of forming the dummy dielectric layer pattern 401, a very high selectivity can be provided with respect to a lower spacer 390 and a hard mask 370. Thus, damage to the spacer 390 and the hard mask 370 by the etching process when forming the dummy dielectric layer pattern 401 can be minimized. Thus, the spacer 390 and the hard mask 370 can be introduced in thinner thickness than that of in a conventional SAC process, and the spacer 390 and the hard mask 370 can be formed of insulating materials having a low dielectric constant, for example, silicon carbide (SiC). As a result, the desired effect of reducing the loading capacitance of a semiconductor device can be additionally realized.

Figure 4A:
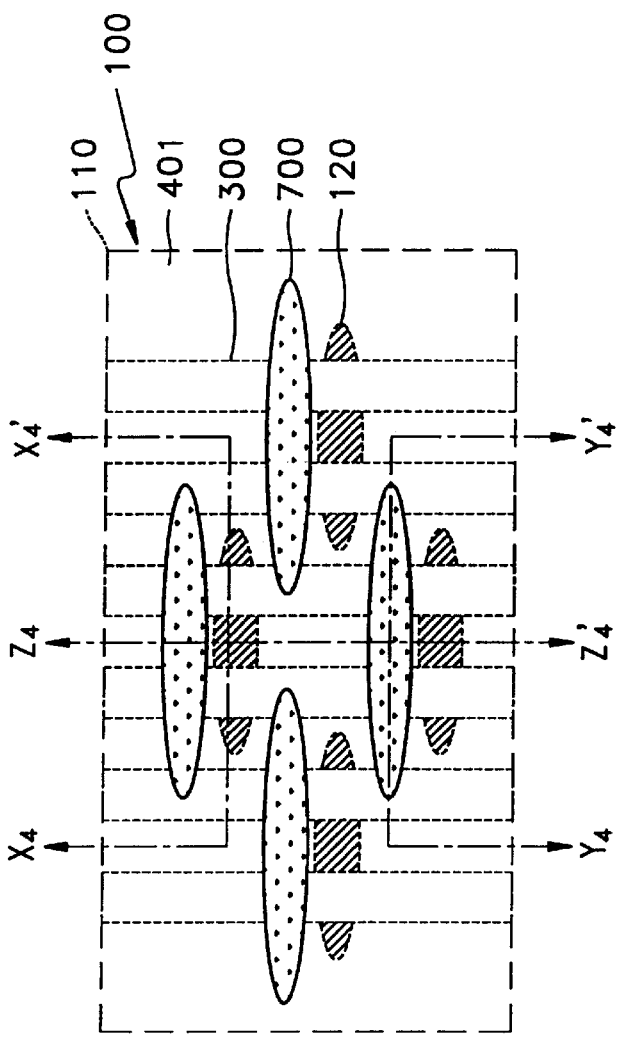
Figure 4B:
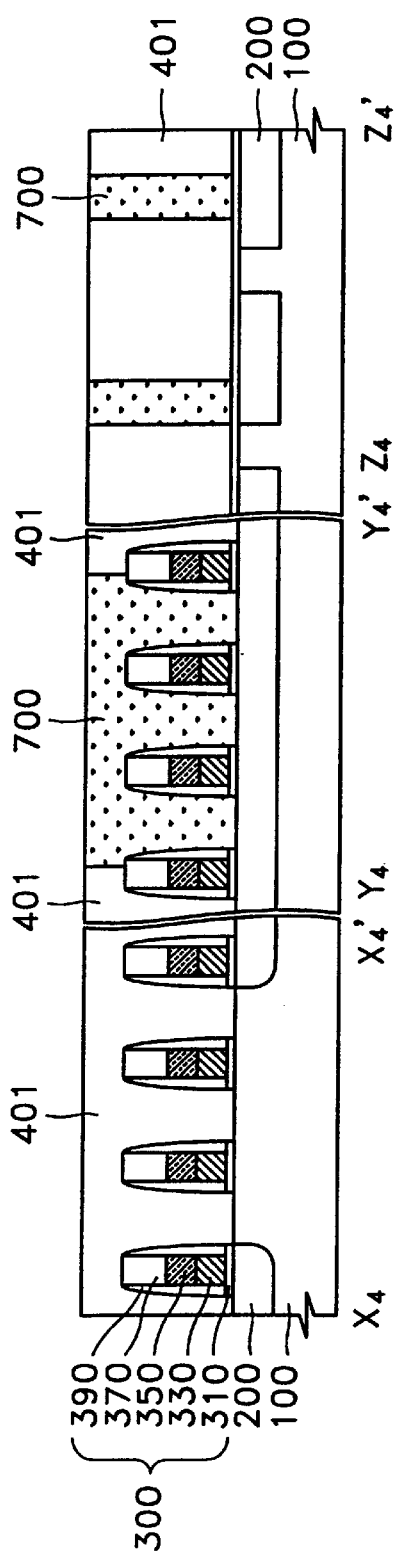

FIG. 4A is a plan view schematically illustrating the step of forming an interdielectric layer pattern 700 for filling the dummy opening 450, and FIG. 4B is a sectional view taken along line $X_4$-$X_4'$, $Y_4$-$Y_4'$, and $Z_4$-$Z_4'$ of FIG. 4A.

Specifically, an interdielectric layer 700 for filling the dummy opening 450 is formed. The interdielectric layer 700 can be formed of insulating materials such as silicon dioxide ($SiO_2$), silicon nitride ($Si_3N_4$), silicon oxynitride (SiON), or silicon carbide (SiC). Here, since an organic material forming the dummy dielectric layer pattern 401 is not resistant to higher processing temperature, preferably, a process for forming the interdielectric layer pattern 700 can be performed at a low temperature, for example, at 400° C. and below. Thus, the process of forming the interdielectric layer pattern 700 can be performed by low temperature CVD or coating.

However, preferably, the interdielectric layer pattern 700 is formed by liquid phase deposition. Silicon dioxide ($SiO_2$) can be selectively deposited by liquid phase deposition as disclosed in U.S. Pat. No. 5,547,900 (assigned to Jengping Lin et al., on Aug. 20, 1996, entitled "Method of fabricating a self-aligned contact using a liquid-phase oxide-deposition process") and a paper (entitled "A Selective $SiO_2$ Film-Formation Technology Using Liquid Phase Deposition for Fully Planarized Multilevel Interconnections, by Tetsuya Homma et al., J. Electrochm. Soc., Vol. 140, No. 8, pp2410-2414, in 1993), the text of which are both hereby incorporated by reference into this specification.

When deposited by liquid phase deposition, silicon dioxide ($SiO_2$) is not deposited on the organic material. Thus, the interdielectric layer pattern 700 of silicon dioxide ($SiO_2$) is deposited only in the dummy opening 450 of the dummy layer 401 and grows. When the liquid phase deposition is precisely controlled, the interdielectric layer pattern 700 can be selectively formed in the dummy opening 450 of the dummy dielectric layer pattern 401 comprising organic materials without the following process. The interdielectric layer pattern 700 by the liquid phase deposition has very high filling characteristics that are characteristic of a liquid phase deposition process. Thus, the interdielectric layer pattern 700 can be formed without a seam or a void between the gate lines 300.

Meanwhile, in a case where the interdielectric layer pattern 700 is formed using a low temperature CVD method, due to the high aspect ratio between the gate lines 300, a seam or a void may occur in the interdielectric layer pattern 700. However, the void or the seam is closed and isolated by insulating materials forming the interdielectric layer pattern 700. That is, the interdielectric layer pattern 700 grows from the inside and bottom of the dummy opening 450 due to the deposition characteristics of CVD, and so the void or the seam occurs in the center of the interdielectric layer pattern 700 between the gate lines 300.

Thus, the void or the seam does not extend to the outside of the interdielectric layer pattern 700 in either lateral direction. As a result, although a conductive material is filled in the void or the seam in the following process of depositing the conductive material, it is possible to prevent the residual conductive material from acting as a defect that causes an electrical short-circuit such as a bridge.

In addition, in a case where the interdielectric layer pattern 700 is extended to cover the surface of the dummy dielectric layer pattern 401, the portion of the interdielectric layer pattern 700 covering the dummy dielectric layer pattern 401 is chemical mechanical polished (CMP) or dry-etched back to the dummy opening 450. Here, a wet etch back process can also be used. The polishing or etch back process is performed so that the surface of the dummy dielectric layer pattern 401 may be exposed.

Figure 5A:
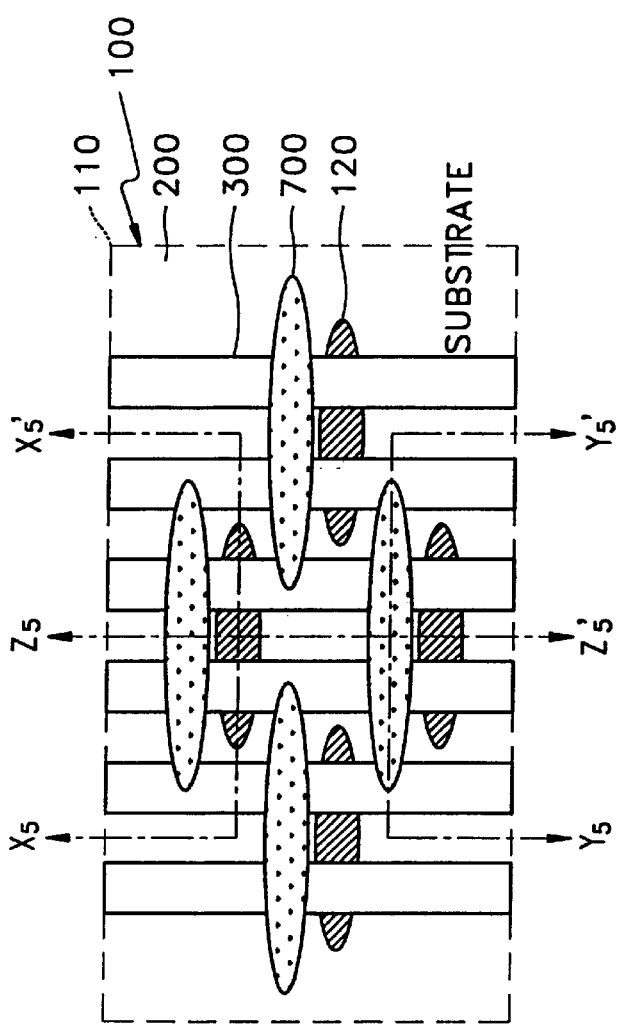
Figure 5B:
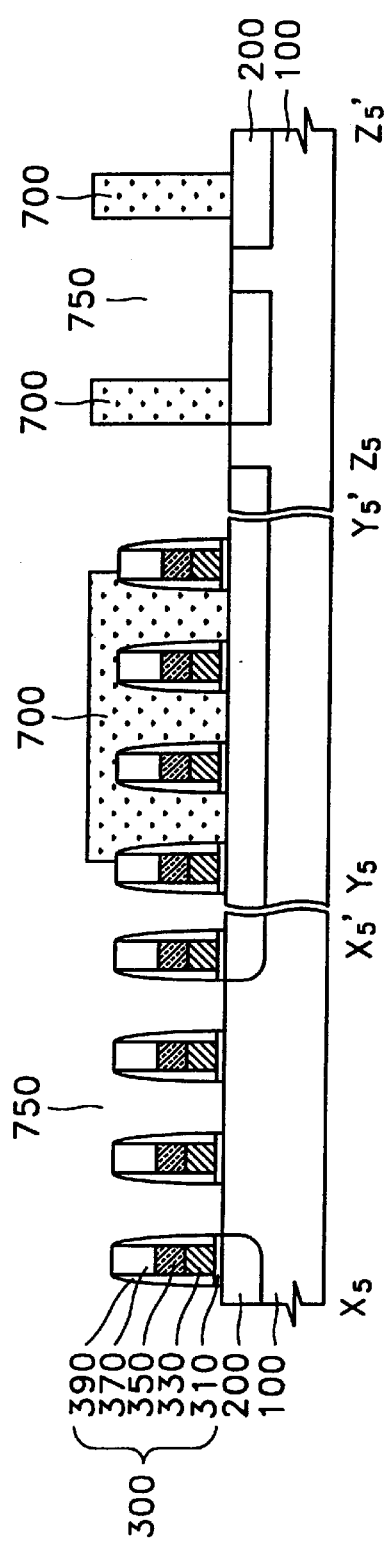

FIG. 5A is a plan view schematically illustrating the step of selectively removing a dummy dielectric layer pattern 401, and FIG. 5B is a sectional view taken along line $X_5$-$X_5'$, $Y_5$-$Y_5'$, and $Z_5$-$Z_5'$ of FIG. 5A.

In detail, a contact opening 750 is formed by selectively removing a dummy dielectric layer pattern 401 using an interdielectric layer pattern 700 as an etching mask. Thus, the contact opening 750 is located in a portion in which the dummy dielectric layer pattern 401 is located.

The selective removal of the dummy dielectric layer pattern 401 is performed by a dry etching process. For example, in a case where the dummy dielectric layer pattern 401 is formed of a resist material or an organic antireflective layer material, the etching process can be performed using ashing. That is, the etching process can be performed by dry etching in which an oxygen source is used. Since the resist material or the organic antireflective layer material forming the dummy dielectric layer pattern 401 is formed of organic materials such as polymer, the resist material or the organic antireflective layer material can be removed by the ashing.

Where the interdielectric layer pattern 700 is formed of inorganic materials such as silicon dioxide ($SiO_2$), the interdielectric layer pattern 700 is not etched by a dry etching process such as the ashing. A very high etching selectivity can be realized in the dry etching, and the dummy dielectric layer pattern 401 can be selectively removed. After the ashing, the etching process can be supplemented by additionally performing a wet etching process such as a strip in which phosphoric acid is used, and by removing residual materials after ashing.

Meanwhile, in a case where the dummy dielectric layer pattern 401 is formed of an organic insulator, the etching process can be performed by dry etching in which etching gas containing nitrogen (N) gas or hydrogen (H) gas is used. Since inorganic materials such as silicon dioxide ($SiO_2$) forming the interdielectric layer pattern 700 is not etched by the dry etching in which the etching gas is used, the dummy dielectric layer pattern 401 can be selectively removed.

Meanwhile, in the etching process of removing the dummy dielectric layer pattern 401, a very high etch selectivity can be provided with respect to a lower spacer 390 and a hard mask 370. Thus, damage to the spacer 390 and the hard mask 370 by etching away the dummy dielectric layer pattern 401 can be minimized.

As described above, a contact opening 750 for exposing the lower semiconductor substrate 100 adjacent to the spacer 390 of the gate 330 and 350 is formed by selectively removing the dummy dielectric layer pattern 401. Since the semiconductor substrate 100 exposed by the contact opening 750 includes active regions 120, the semiconductor substrate 100 includes a portion to which a contact to be later formed is electrically connected.

In a preferred embodiment, the contact opening 750 is formed to expose a plurality of gate lines 300 and the semiconductor substrate 100 adjacent to the gate lines 300 other than a contact hole formed in the conventional SAC process, while selectively exposing only a specific portion of the semiconductor substrate between gate lines.

Figure 6A:
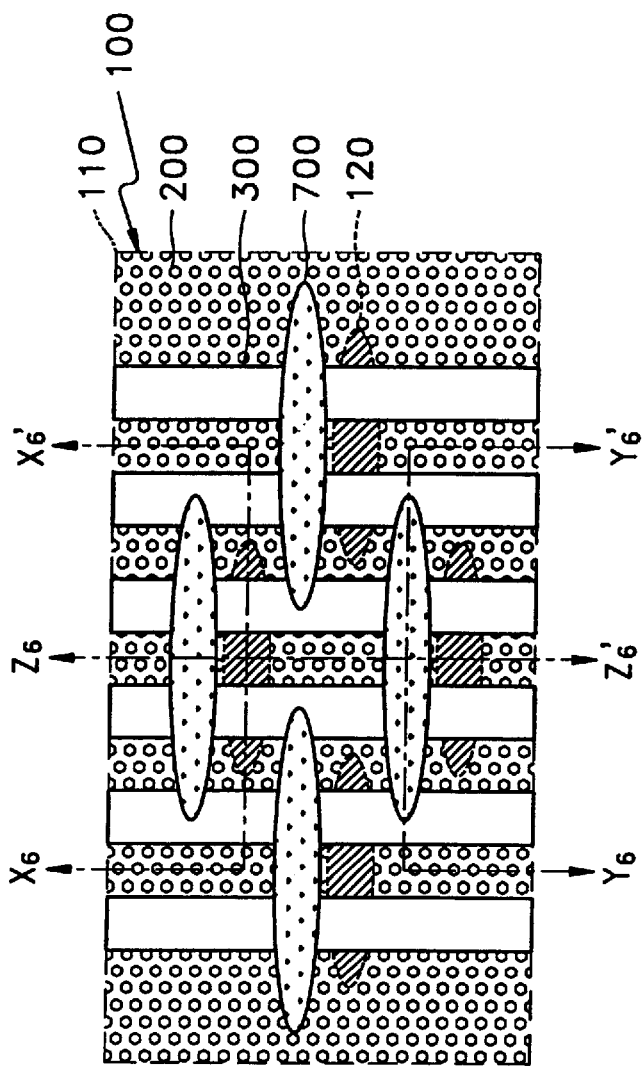
Figure 6B:
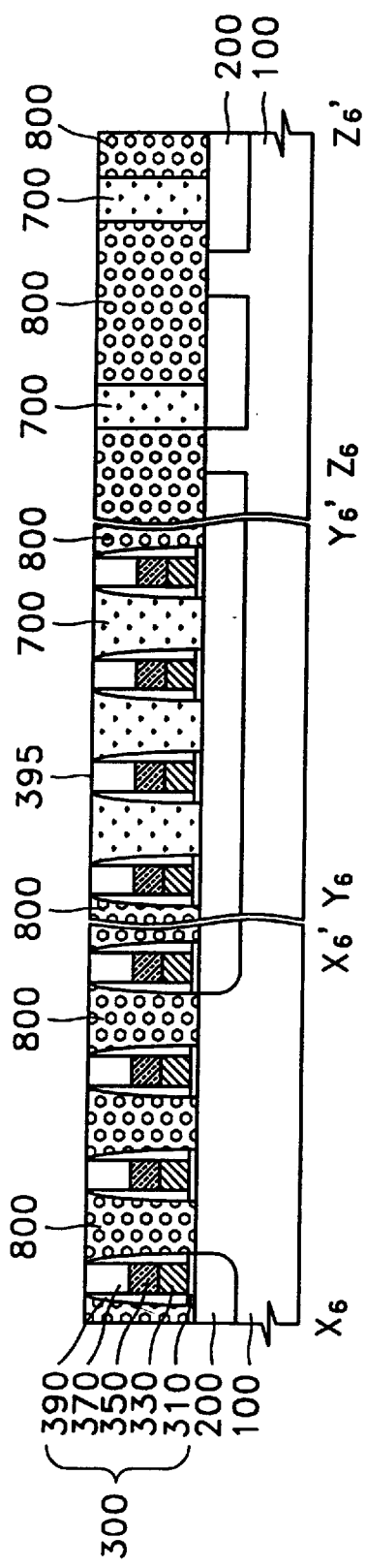

FIG. 6A is a plan view schematically illustrating the step of forming a conductive contact body 800 electrically connected to a semiconductor substrate 100 exposed by the contact opening 750, and FIG. 6B is a sectional view taken along line $X_6$-$X_6'$-$Y_6$-$Y_6'$-$Z_6$-$Z_6'$ of FIG. 6A.

Specifically, after depositing a conductive layer which fills the formed contact opening 750 and is electrically connected to the exposed semiconductor substrate 100, the surface of the conductive layer is removed CMP or dry and wet etched back, so that the conductive material remaining is separated into gaps between gate lines 30. Thus, the conductive contact body 800 is formed. In order to completely separate the conductive layer into the conductive contact body 800, the surface of an interdielectric layer pattern 700 lower of the conductive layer is also etched. Here, preferably, in the etching, a hard mask 370 for protecting the top of the gates 330 and 350 is used as an etching stop. As a result, two opposite sidewalls of the conductive contact body 800 are separated by a spacer 390 of gate 330 and 350, and the other two opposite sidewalls are separated by the interdielectric layer pattern 700.

The conductive layer can be formed of conventional conductors such as polycrystalline silicon, tungsten (W), titanium (Ti), titanium nitride (TiN), tungsten silicide (WSi), platinum (Pt), aluminum (Al), or copper (Cu).

In the preferred embodiment of the present invention, the conductive contact body 800 used as a buried contact (BC) was described, but, the present invention can be also applied to form a storage nod pad or a direct contact (DC).

The present invention can provide a conductive contact body surrounded by the interdielectric layer pattern and the spacer by etching the surface of the conductive layer that is deposited for filling the contact opening. Here, the damage to the lower layer can be minimized by forming a dummy dielectric layer pattern for the contact opening of an organic material and by forming the interdielectric layer pattern of silicon dioxide ($SiO_2$) and by using a high etching selectivity between the dummy dielectric layer pattern and the interdielectric layer pattern.

That is, by using the high etching selectivity, damage to the spacer and the hard mask for protecting the conductive pattern, such as the lower gate, can be minimized. The contact opening can be formed by selectively removing the dummy dielectric layer pattern using the interdielectric layer pattern filled in the dummy opening as an etching mask. Even if an exposed portion of the spacer or the hard mask is damaged by the dummy opening process, the exposed portion is shielded by the following interdielectric layer pattern, thereby preventing an electrical short-circuit.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a conductive contact in a semiconductor device, comprising the steps of:
   providing a semiconductor substrate;
   forming a conductive pattern on the substrate, the conductive pattern including a plurality of conductive lines;
   forming a shielding dielectric layer covering the sides and top of the conductive pattern;
   forming a dummy dielectric layer covering the conductive pattern and the substrate between the conductive lines;
   patterning the dummy dielectric layer to define a contact area covered by the dummy dielectric layer, and forming a dummy opening in the dummy dielectric layer adjacent the contact area;
   filling the dummy opening with an interdielectric material having a lower etch-rate than that of the dummy dielectric layer;
   forming a contact opening and exposing the contact area of the semiconductor substrate and the conductive pattern by selectively etching the dummy dielectric layer covering the contact area using the interdielectric layer adjacent the contact area as an etching mask;
   forming a conductive layer which fills the contact opening and is electrically connected to the semiconductor substrate; and
   etching the upper surfaces of the conductive layer and the interdielectric layer pattern to form at least one conductive contact body surrounded by the shielding dielectric layer and the etched interdielectric layer pattern.

2. The method according to claim 1, wherein the shielding dielectric layer has a lower dry etch-rate than that of the dummy dielectric layer.

3. The method according to claim 2, wherein the shielding dielectric layer is formed of silicon dioxide ($SiO_2$), silicon nitride ($Si_3N_4$), silicon carbide (SiC), silicon oxynitride (SiON), or aluminum oxide ($Al_2O_3$).

4. The method according to claim 1, wherein the shielding dielectric layer includes a hard mask for protecting the top of the conductive pattern and a spacer for protecting the sides of the conductive pattern.

5. The method according to claim 1, wherein the dummy dielectric layer is formed of materials having a higher dry or wet etch-rate than of the interdielectric layer pattern.

6. The method according to claim 1, wherein the dummy dielectric layer is formed of an organic material.

7. The method according to claim 6, wherein the organic material is an organic antireflective material, a resist material, or an organic insulator.

8. The method according to claim 7, wherein the dummy dielectric layer is formed of the organic insulator, and the step of forming the dummy dielectric layer pattern comprises the steps of:
   forming a photoresist pattern on the dummy dielectric layer; and
   using the photoresist pattern as an etching mask and selectively patterning the dummy dielectric layer by dry etching with an etching gas comprising nitrogen (N) and hydrogen (H).

9. The method according to claim 1, wherein the dummy dielectric layer is formed of the organic antireflective layer or the resist material, and the step of forming the dummy dielectric layer pattern comprises the steps of:
   forming a photoresist pattern for interposing an etching mask layer on the lower dummy dielectric layer pattern, on the dummy dielectric layer; and
   using the etching mask layer selectively patterning the dummy dielectric layer by dry etching with an etching gas comprising an oxygen source.

10. The method according to claim 9, wherein the etching mask layer is formed of silicon dioxide ($SiO_2$), silicon nitride ($Si_3N_4$), silicon carbide (SiC), or silicon oxynitride (SiON).

11. The method according to claim 1, wherein the interdielectric layer pattern is formed of silicon dioxide ($SiO_2$), silicon nitride ($Si_3N_4$), silicon carbide (SiC), or silicon oxynitride (SiON).

12. The method according to claim 1, wherein the interdielectric layer pattern is formed by selective liquid phase deposition of silicon dioxide ($SiO_2$) in the dummy opening.

13. The method according to claim 1, wherein the dummy opening exposes an isolation region of the semiconductor substrate adjacent to the conductive line, and the contact opening exposes an active region of the semiconductor substrate adjacent to the dummy opening.

14. The method according to claim 1, wherein the dummy opening is formed to intersect the conductive line.

15. The method according to claim 1, wherein the dummy opening and the contact opening are located in a cell region of the semiconductor substrate.

16. The method according to claim 1, where in the step of etching the upper surfaces of the conductive layer and the interdielectric layer the shielding dielectric layer covering the top of the conductive pattern serves as an etch stop.

17. The method according to claim 1, where in the step of etching the upper surfaces of the conductive layer and the interdielectric layer includes an etching step selected from the group consisting of a wet etch back, a dry etch back, or chemical-mechanical polishing.

18. A method for manufacturing a conductive contact of a semiconductor device, comprising the steps of:
   providing a semiconductor substrate;
   forming a conductive pattern including a plurality of conductive lines;
   forming a shielding dielectric layer covering the sides and top )f the conductive pattern;
   forming a dummy dielectric layer covering the conductive pattern and at least a portion of the substrate between the conductive lines, the dummy dielectric layer comprising an organic material;
   patterning the dummy dielectric layer to define a contact area covered by the dummy dielectric layer, and forming a dummy opening in the dummy dielectric layer adjacent the contact area;
   filling the dummy opening with an interdielectric material having a lower etch-rate than that of the dummy dielectric layer by selective liquid phase deposition of silicon dioxide ($SiO_2$) in the dummy opening;
   forming a contact opening and exposing the contact area of the semiconductor substrate and the conductive pattern by selectively etching the dummy dielectric layer covering the contact area using the interdielectric layer adjacent the contact area as an etching mask;
   forming a conductive layer which fills the contact opening and is electrically connected to the semiconductor substrate; and
   etching the upper surfaces of the conductive layer and the interdielectric layer pattern to form at least one conductive contact body surrounded by the shielding dielectric layer and the etched interdielectric layer pattern.

19. The method according to claim 18, wherein the organic material is selected from the group consisting of an organic antireflective material, an organic resist material, or an organic insulator.

20. The method according to claim 19, wherein the dummy dielectric layer is formed of the organic insulator, and the step of patterning the dummy dielectric layer comprises the steps of:
   forming a photoresist pattern on the dummy dielectric layer; and
   using the photoresist pattern as an etching mask and selectively patterning the dummy dielectric layer by dry etching using an etching gas comprising nitrogen (N) and hydrogen (H).

21. The method according to claim 19, wherein the dummy dielectric layer is formed of a material selected from the group consisting of an organic antireflective material and an organic resist material, and the step of patterning the dummy dielectric layer comprises the steps of:
   forming a photoresist pattern on the dummy dielectric layer; and, using the photoresist pattern as an etching mask layer, selectively patterning the dummy dielectric layer by dry etching using an etching gas containing an oxygen source.

22. A method of forming a conductive contact in a semiconductor device, comprising the steps of:
   providing a semiconductor substrate;
   forming a conductive pattern on the substrate;
   covering the sides of the conductive pattern with a first shielding dielectric material;
   covering the top of the conductive pattern with a second shielding dielectric material;
   forming a dummy dielectric layer covering the substrate and the conductive pattern;
   patterning the dummy dielectric layer to define a contact area and to form a dummy opening exposing a portion of the substrate and a portion of the conductive pattern adjacent to the contact area;
   depositing an interdielectric material in the dummy opening, the interdielectric material selected to have a higher etch resistance than the material forming the dummy dielectric layer and the first and second shielding dielectric materials;

forming a contact opening by selectively etching the dummy dielectric layer to expose the contact area of the substrate and the conductive pattern; and, depositing a conductive material in the contact opening and forming an electrical contact in electrical contact with the contact area of the substrate and which is electrically isolated from the conductive pattern.

23. A method of forming a conductive contact in a semiconductor device according to claim 22 wherein the electrical contact does extends upwardly no higher than the first shielding material covering the top of the conductive pattern.

24. A method of forming a conductive contact in a semiconductor device according to claim 22 which further comprises the step of:

etching the conductive material and the interdielectric material to a height no greater than the upper surface of the first shielding material covering the conductive pattern.

* * * * *

UNITED STATES PATENT AND TRADEMARK OFFICE
CERTIFICATE OF CORRECTION

PATENT NO.     : 6,429,107 B2
DATED          : August 6, 2002
INVENTOR(S)    : Kim et al.

It is certified that error appears in the above-identified patent and that said Letters Patent is hereby corrected as shown below:

Column 9,
Line 65, "top )f" should read -- top of --.

Signed and Sealed this

Twenty-fifth Day of March, 2003

JAMES E. ROGAN
*Director of the United States Patent and Trademark Office*